United States Patent [19]
Anderson, deceased et al.

[11] Patent Number: 5,121,084
[45] Date of Patent: Jun. 9, 1992

[54] BALANCE AND PROTECTION FOR STACKED RF AMPLIFIERS

[75] Inventors: James A. Anderson, deceased, late of Gardena, by Roger K. Anderson, administrator; Carlos H. Gonzalez, La Mirada; Robert F. McClanahan, Valencia; Robert D. Washburn, Malibu, all of Calif.

[73] Assignee: Hughes Aircraft Company, Los Angeles, Calif.

[21] Appl. No.: 501,649

[22] Filed: Mar. 29, 1990

[51] Int. Cl.[5] .................................................. H03F 3/68
[52] U.S. Cl. ..................................... 330/295; 330/284; 330/297
[58] Field of Search ................... 330/124 R, 144, 145, 330/202, 284, 295, 297

[56] References Cited
U.S. PATENT DOCUMENTS 4,631,493 12/1986 Vendelin ..................... 330/295 X Primary Examiner—James B. Mullins
Attorney, Agent, or Firm—Leonard A. Alkov; Wanda K. Denson-Low

[57] ABSTRACT

A balance circuit for an amplifier circuit having $2^M$ amplifiers serially biased across a supply potential node and a common potential node, where M is an integer greater than 0, and having respective $2^M - 1$ interstage bias nodes and voltages between the amplifiers which are driven by respective input drive signals provided by $2^M - 1$ 2-way power splitters. A voltage reference circuit provides as to each power splitter first and second reference potentials respectively associated therewith. A plurality of control circuits are associated with respective power splitters and interstage nodes. Each control circuit is responsive to the associated first and second reference potentials and the interstage bias node for controlling the signal levels of the first and second drive signals provided by the associated 2-way splitter as a function of the associated interstage bias potential relative to the first and second reference potentials.

4 Claims, 3 Drawing Sheets

BALANCE AND PROTECTION FOR STACKED RF AMPLIFIERS

BACKGROUND OF THE INVENTION

The disclosed invention generally relates to bias control circuits, and more particularly is directed to a bias balance control circuit for maintaining proper bias voltage balance between serially biased amplifiers.

In order to utilize higher DC supply voltages, amplifier circuits have utilized serially biased amplifiers wherein the bias voltage across each amplifier is less than the supply voltage. An example of serially biased amplifiers is set forth in United States application Ser. No. 07/357,400, filed May 25, 1989, for VHF DC-DC Power Supply, which is assigned to the assignee of the subject application.

A consideration with serially biased amplifiers is the variation in the DC voltages across each amplifier, which if sufficiently large causes failure of active components in the amplifiers. Such variation can be due to various factors, including for example changes in transistor gain due to temperature and/or aging, and load variations. As a result of the bias voltage variation, it was necessary to select transistors with similar voltage breakdown and current gain characteristics.

SUMMARY OF THE INVENTION

It would therefore be an advantage to provide a bias balance circuit that maintains substantially constant bias voltages across serially biased amplifiers.

Another advantage would be to provide a serially biased amplifier having substantially constant bias voltages across the amplifier stages thereof.

The foregoing and other advantages are provided in a balance circuit for an amplifier circuit having $2^M$ amplifiers serially biased across a supply potential node and a common potential node, where M is an integer greater than 0, and having respective $2^M-1$ interstage bias nodes and voltages between the amplifiers which are driven by respective input drive signals provided by $2^M-1$ 2-way power splitters. A voltage reference circuit provides as to each power splitter first and second reference potentials respectively associated therewith. A plurality of control circuits are associated with respective power splitters and interstage nodes. Each control circuit is responsive to the associated first and second reference potentials and the interstage bias node for controlling the signal levels of the first and second drive signals provided by the associated 2-way splitter as a function of the associated interstage bias potential relative to the first and second reference potentials.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION OF THE DISCLOSURE

Figure 1:
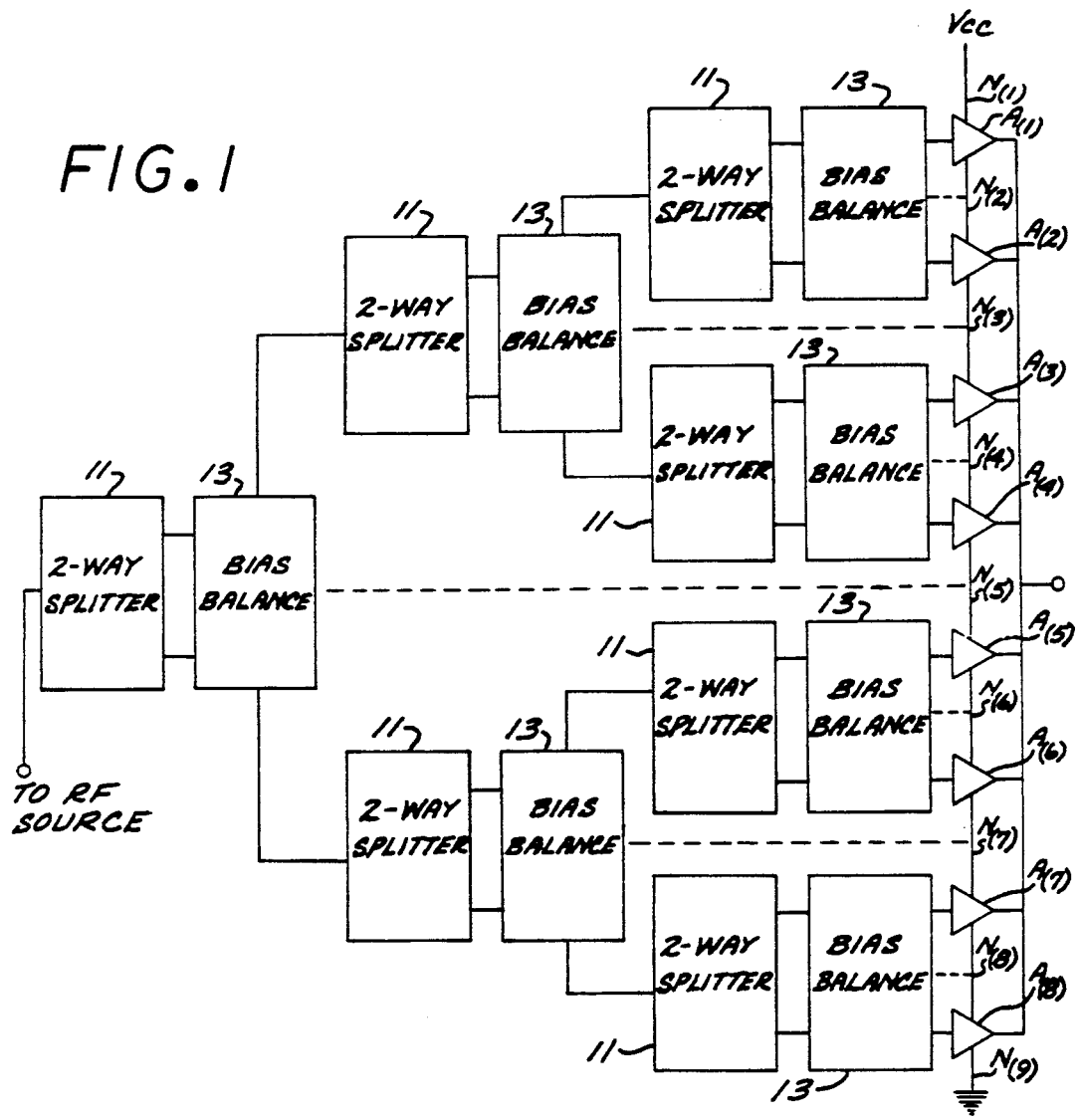
FIG. 1 is a generalized block diagram illustrating the use of the balance circuit of the invention with serially biased amplifiers.

In the following detailed description and in the several figures of the drawing, like elements are identified with like reference numerals.

Referring now to FIG. 1, a plurality of power amplifiers A(1) through A(8) are serially biased between a supply potential $V_{cc}$ and a common reference potential shown as ground. For reference, the biasing nodes connected to the amplifiers are identified as nodes N(1) through N(9), where the node N(1) is connected to the supply potential and the node N(9) is connected to ground. Thus, the amplifier A(1) is connected between the biasing nodes N(1) and N(2), the amplifier A(2) is connected between the biasing nodes N(2) and N(3), and so forth. By way of illustrative example, the serially biased power amplifiers can comprise stacked amplifiers as disclosed in U.S. Patent application Ser. No. 07/357,400, filed May 25, 1989, which is incorporated herein by reference.

The input drives to the amplifiers A(1) through A(8) are provided by the outputs of 2-way splitters 11 as controlled by bias balance circuits 13. In particular, each splitter 11 has an associated balance circuit 13 connected to its 2 outputs. The inputs to the 2-way splitters 11 connected to the amplifiers are provided by further 2-way splitters, which in turn receive inputs from a single −2-way splitter. The single −2-way splitter 11 on the left side of the circuit receives its input from an RF source, such as an RF pre-amplifier.

The foregoing serially biased amplifier architecture is based on the requirement that the interstage bias node N(J) have an associated balance circuit 13 and 2-way splitter 11 (referred to as a balance/splitter subcircuit), and can be generalized as follows. The amplifier architecture includes $2^M$ serially biased amplifiers, where M is an integer greater than 0. The number of balance/splitter subcircuits is $2^M-1$, which are distributed as follows. There are $2^M-1$ subcircuits providing inputs to the amplifiers, and such subcircuits receive inputs from $2^{M-2}$ subcircuits, which in turn receive inputs from $2^{M-3}$ subcircuits, and so forth. Numerically, the subcircuits are in groups of $2^{M-I}$, where I=1, ... M and also identifies the location of the subcircuit group relative to the amplifiers. Thus, group 1 (I=1) provides inputs directly to the amplifiers, group 2 (I=2) provides inputs to group 1, and so forth.

Figure 2:
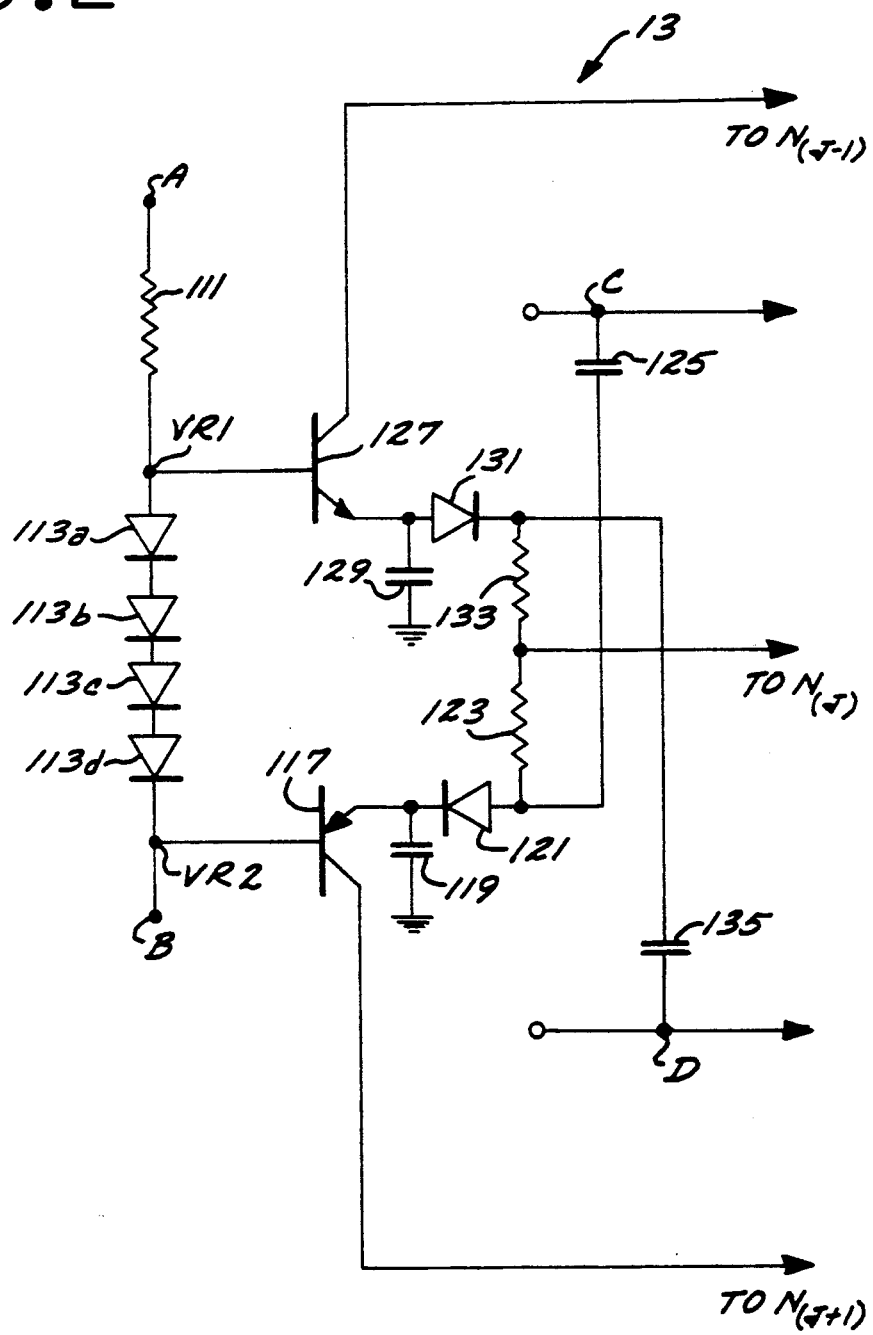
FIG. 2 is a schematic diagram of a bias balance circuit in accordance with the invention.
Figure 3:
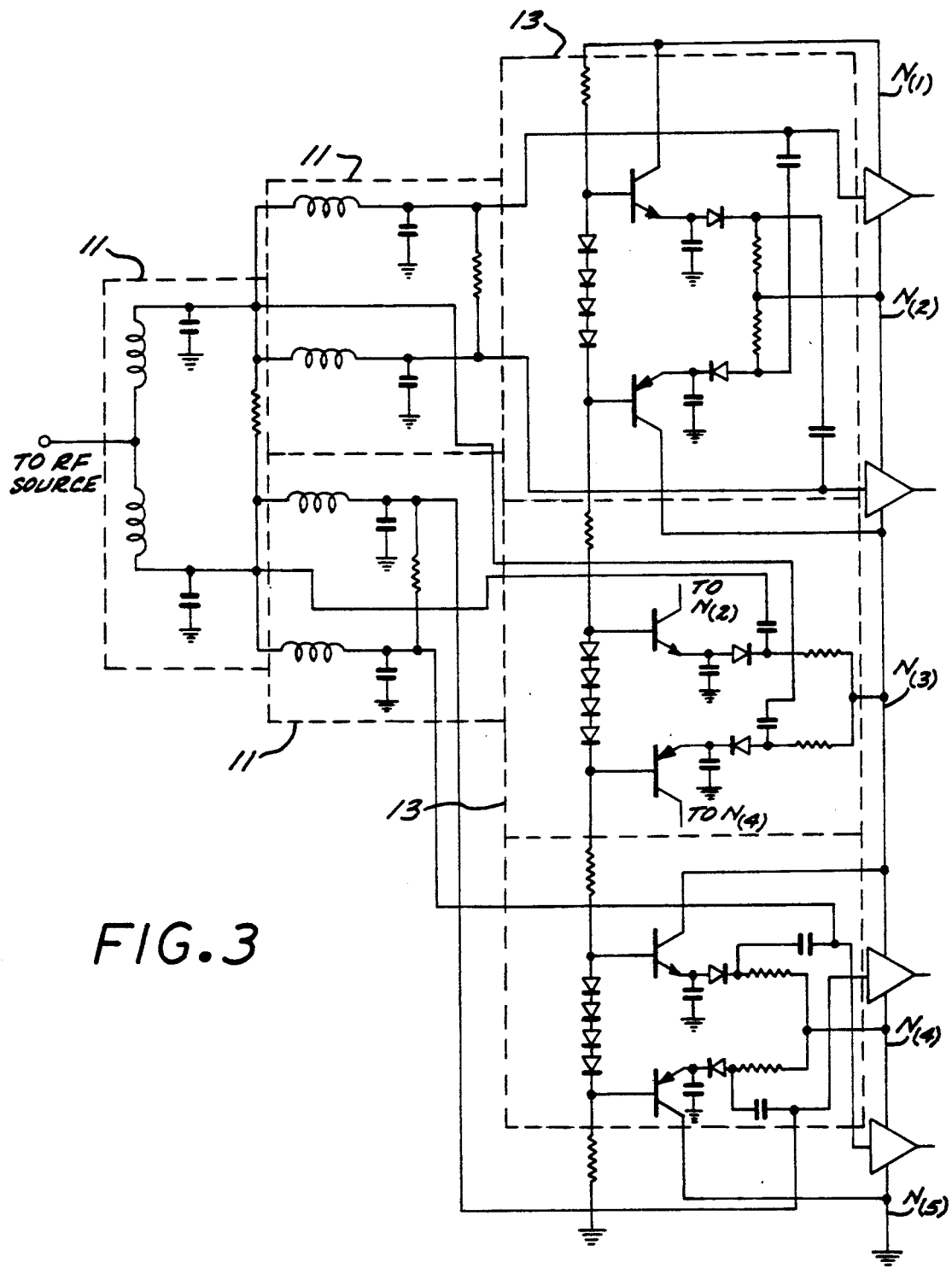
FIG. 3 is a schematic diagram illustrating the particular connections of bias balance circuits in the circuit of FIG. 1.

Referring now to FIG. 2, shown therein is a schematic diagram of the balance circuit 13 for the bias node N(J), where J=2, ... $2^M$, which includes serially connected diodes 113a, 113b, 113c, 113d, identified collectively as serial diodes 113. The anode of the diode 113a is connected to one terminal of a resistor 111 which in the amplifier circuit has its other terminal connected to either (a) the supply voltage $V_{cc}$ or (b) the cathode of the diode 113d of the balance circuit 13 associated with the preceding bias node N(J−1), depending on the associated node N(J). The cathode of the balance circuit associated with the last bias node N($2^M$) that has a balance circuit associated therewith has the cathode of the diode 113d connected to one terminal of a resistor which has its other terminal connected to ground, as illustrated in FIG. 3.

The resistors 111 and the serial diodes 113 of all the balance circuits in the amplifier stack form a reference voltage divider which provides at each balance circuit 13 fixed voltage reference voltages VR1, VR2 at the anode of the diode 113a and at the cathode of the diode 113d.

The base of a PNP transistor 117 is connected to the cathode of the diode 113d, while the collector of such transistor 117 is connected to the bias node N(J+1) immediately subsequent in sequence to the node N(J) associated with the balance circuit. A capacitor 119 is connected between ground and the emitter of the transistor 117 which is further connected to the cathode of a PIN diode 121. A resistor 123 is connected between the anode of the PIN diode 121 and the node N(J) associated with the balance circuit, and a capacitor 125 is connected between the anode of the PIN diode 121 and the first output at a node C of the 2-way splitter associated with the balance circuit.

The base of an NPN transistor 127 is connected to the anode of the diode 113a, while the collector of such transistor 127 is connected to the bias node N(J−1) immediately prior in sequence to the node N(J) associated with the balance circuit. A capacitor 129 is connected between ground and the emitter of the transistor 127 which is further connected to the anode of a PIN diode 131. A resistor 133 is connected between the cathode of the PIN diode 131 and the node N(J) associated with the balance circuit, and a capacitor 135 is connected between the cathode of the PIN diode 131 and the second output at a node D of the 2-way splitter associated with the balance circuit.

The first and second splitter outputs at the nodes C, D are connected to either (a) respective amplifiers or (b) respective 2-way splitter circuits. If connected to amplifiers, the first splitter output at the node C is connected to the amplifier that is connected between the node N(J−1) and the node N(J) (i.e., the amplifier A(J−1)), while the splitter output at the node D is connected to the amplifier that is between the node N(J) and the node N(J+1) (i.e., the amplifier A(J)).

If the splitter outputs at the nodes C, D are connected to splitter circuits, the first splitter output at the node C is connected to a splitter circuit associated with a bias node prior in sequence to the node N(J), while the second splitter output at the node D is connected to a splitter associated with a bias node that is later in sequence to the node N(J).

Generally, the first splitter output at the node C is connected to circuitry associated with a bias node prior in sequence to the node N(J), while the second splitter output at the node D is connected to the circuitry associated with a bias node subsequent in sequence to the node N(J).

The balance circuit 13 associated with the bias node N(J) functions to maintain the voltage at the node N(J) at a level that is substantially centered between the reference voltages VR1 and VR2 of such balance circuit by controlling the splitter drive signals at the nodes C, D. Such control results from the variable series resistance exhibited by the PIN diodes 121, 131 in response to the differences between the bias node voltage NV(J) and the reference voltages VR1, VR2.

More particularly, if the bias node voltage NV(J) increases, the difference between the reference voltage VR1 and the bias voltage NV(J) decreases. The current through the PIN diode 131 decreases and its resistance increases. This causes a reduction in the drive signal shunted to ground via the capacitor 135, the PIN diode 131 and the capacitor 129, and therefore an increase in the splitter output drive signal at the node D.

The increase in the bias voltage NV(J) causes an increase in the difference between the bias voltage NV(J) and the reference voltage VR2. The resistance of the PIN diode 121 decreases, and more drive power is AC shunted to ground via the capacitor 125, the PIN diode 131, and the capacitor 129, which reduces the splitter drive signal at the node C.

Through similar analysis, it should be appreciated that if the bias voltage VN(J) decreases, the drive signal at the splitter first output node C increases while the drive signal at the splitter second output node D decreases.

Referring now to FIG. 3, schematically shown therein are the connections of the bias balance circuits 13 and 2-way splitters 11 for a stack of 4 amplifiers (i.e., M=2) which includes the bias nodes N(2) through N(4) having associated splitters and balance circuits. The RF input to the circuit of FIG. 3 is provided by an appropriate RF source to the 2-way splitter on the left side of the circuit as indicated on the figure. While the splitter circuits in FIG. 3 are shown as being Wilkinson type splitter circuits, it should be appreciated that other types of power splitting circuits can be utilized.

It should be appreciated by a comparison of FIG. 1 and FIG. 3 that the circuit of FIG. 1 can be implemented with two of the circuits of FIG. 3 being stacked, and with the addition of a single 2-way splitter and a bias balance circuit at its output. In the stacked configuration, the top circuit would have its bottom bias node connected to the top bias node of the bottom circuit.

The foregoing has been a disclosure of a bias balance circuit for serially biased, stacked amplifiers which advantageously controls the interstage bias voltages between the amplifiers to prevent substantial variations. The bias balance circuit compensates for variation in the voltages across the respective amplifiers, and moreover avoids the need for close matching of the voltage breakdown and current gain characteristics of the amplifier transistors.

Although the foregoing has been a description and illustration of specific embodiments of the invention, various modifications and changes thereto can be made by persons skilled in the art without departing from the scope and spirit of the invention as defined by the following claims.

What is claimed is:

1. A balance circuit for an amplifier circuit having $2^M$ amplifiers serially biased across a supply potential node and a common potential node, where M is an integer greater than 0, and having respective $2^M-1$ interstage bias nodes and voltages between the amplifiers which are driven by respective input drive signals provided by $2^M-1$ 2-way power splitters, the balance circuit comprising:

reference means for providing from each power splitter to each amplifier first and second reference potentials respectively associated therewith; and a plurality of control means associated with respective power splitters and interstage nodes, each control means being responsive to said associated first and second reference potentials and associated interstage bias node potential for controlling the signal levels of first and second drive signals provided by the associated 2-way splitter as a function of the level of the associated interstage bias potential relative to said associated first and second reference potentials.

2. The balance circuit of claim 1 wherein said plurality of control means comprises:
   first comparison means for comparing the associated interstage bias potential with said associated second reference potential;
   second comparison means for comparing the associated interstage bias potential with said associated first reference potential;
   first attenuating means responsive to said first comparison means for selectively attenuating the first drive signal of the associated 2-way power splitter; and
   second attenuating means responsive to said second comparison means for selectively attenuating the second drive signal of the associated 2-way power splitter.

3. The balance circuit of claim 2 wherein said first attenuating means includes a first PIN diode and a first capacitor for shunting a first splitter output to ground, and wherein said second attenuating means includes a second PIN diode and a second capacitor for shunting a second splitter output to ground.

4. The balance circuit of claim 3 wherein said first and second comparison means comprise respective complementary transistors for controlling the respective resistances of said first and second PIN diodes.

* * * * *